United States Patent [19]

Dillard et al.

[11] 4,335,164

[45] Jun. 15, 1982

[54] CONDITIONING OF POLYAMIDES FOR ELECTROLESS PLATING

[75] Inventors: David A. Dillard, Diamond Bar; Eileen Maguire, Arcadia; Lawrence P. Donovan, III, Monrovia, all of Calif.

[73] Assignee: Crown City Plating Co., El Monte, Calif.

[21] Appl. No.: 218,513

[22] Filed: Dec. 22, 1980

Related U.S. Application Data

[63] Continuation-in-part of Ser. No. 159,585, Jun. 16, 1980, which is a continuation-in-part of Ser. No. 970,923, Dec. 19, 1978, abandoned, which is a continuation-in-part of Ser. No. 159,503, Jun. 16, 1980, Pat. No. 4,309,462, which is a continuation-in-part of Ser. No. 970,929, Dec. 19, 1978, abandoned.

[30] Foreign Application Priority Data

Nov. 7, 1979 [GB] United Kingdom ................ 7948565

[51] Int. Cl.$^3$ .............................................. B05D 3/10
[52] U.S. Cl. ..................................... 427/304; 427/305; 427/306; 427/307; 427/444; 156/668
[58] Field of Search .............................. 427/304–307, 427/444; 156/668

[56] References Cited

U.S. PATENT DOCUMENTS

| | | | |
|---|---|---|---|
| 3,574,070 | 4/1971 | Sahely | 156/625 |
| 3,686,017 | 8/1972 | Menikheim et al. | |
| 4,125,649 | 11/1978 | Donovan | 427/307 |
| 4,227,963 | 10/1980 | Wiggins | 156/668 |

FOREIGN PATENT DOCUMENTS

| | | |
|---|---|---|
| 551820 | 3/1943 | United Kingdom . |
| 626380 | 7/1949 | United Kingdom . |
| 896606 | 5/1962 | United Kingdom . |
| 1015273 | 12/1965 | United Kingdom . |
| 1310306 | 3/1973 | United Kingdom . |

*Primary Examiner*—Norman Morgenstern
*Assistant Examiner*—Janyce A. Bell
*Attorney, Agent, or Firm*—Christie, Parker & Hale

[57] ABSTRACT

Polyamide substrates are pre-conditioned for electroless plating by contact with an aqueous alkaline solution having a pH of at least about 10 and etched with an aqueous acid etch solution of an organic acid containing at least two carbon atoms, in combination with from 1 to 10 percent by weight of an inorganic acid which is nondeleteriously reactive with the organic acid. Trichloroacetic acid is the preferred organic acid and sulfuric, hydrochloric and/or nitric the preferred inorganic acids. Contact with the aqueous alkaline solution can be eliminated where the polyamide is caprolactam.

32 Claims, No Drawings

CONDITIONING OF POLYAMIDES FOR ELECTROLESS PLATING

CROSS-REFERENCE TO RELATED APPLICATIONS

This application is a continuation-in-part of application Ser. No. 06/159,585, filed June 16, 1980, which is a continuation-in-part of application Ser. No. 970,923, filed Dec. 19, 1978, now abandoned, and application Ser. No. 06/159,503, filed June 16, 1980, now U.S. Pat. No. 4,309,462 which is a continuation-in-part of application Ser. No. 970,929, filed Dec. 19, 1978, now abandoned.

BACKGROUND OF THE INVENTION

The present invention relates to improvements in electroless plating of polyamides. In our pending U.S. application Ser. No. 06/159,585, incorporated herein by reference, there is disclosed and claimed a process for preparing the surface of polyamide substrates for electroless plating, comprising forming a conditioned polyamide substrate by etching with an aqueous alkaline conditioning solution having a pH of at least about 10 and maintained at 150° F. to the lesser of the boiling point of the solution and the softening point of the polyamide substrate for a time sufficient to render the substrate receptive to etch by an organic acid. This is followed by etching of the conditioned polyamide substrate with an aqueous acid etch solution preferably comprising at least one organic acid containing from 2 to about 10 carbon atoms in the molecule and present in the aqueous solution in a concentration of at least about 3 percent by weight of solution. The process renders the conditioned polyamide substrate uniformly and directly receptive to a metal electroless plating catalyst and is adaptive to the treatment of Nylon 6 and Nylon 6,6. Where the substrate is a caprolactam polymer, etching can be achieved without contact with the aqueous alkaline conditioning solution and, as described in Application Ser. No. 06/159,503, is preferably accomplished with the use of the aqueous solution of an organic acid containing from 2 to 4 carbon atoms in the molecule. Trichloroacetic acid is the presently preferred organic acid. Adhesion to a substrate is enhanced by increased concentration of the acid etchant or prolonged contact time. Because some organic acids are solvents for the polyamides, there is a tendency in their use for the substrate surface to absorb the organic acid. This can induce surface softening and, if extensive, will form, for a period of time, a soft, easily scored surface.

A need has existed to improve adhesion to the surface of the polyamide substrates treated in accordance with the process of the above-identified applications, while avoiding surface softening.

SUMMARY OF THE INVENTION

It has now been found that an adhesion of a deposited metal plate to the surface of a polyamide substrate conditioned for electroless plating by a process which includes conditioning the polyamide substrate for reception of an electroless plating catalyst by contacting the polyamide substrate with an aqueous organic acid etch solution comprising at least one water-soluble organic acid containing from 2 to about 10 carbon atoms in the molecule and present in an aqueous solution to a concentration of at least 3 percent by weight of solution can, all other factors being constant, be materially increased by including in the aqueous organic acid etch solution from about 1 to about 10 percent by weight of an inorganic acid which is substantially nondeleteriously reactive with the organic acid. The preferred inorganic acids are the mineral acids, namely, sulfuric, hydrochloric, and nitric, with hydrochloric being particularly preferred. The preferred range of inorganic acid concentration is from about 1 to about 5 percent by weight of solution. The process of this invention preferably includes, prior to contact with the aqueous organic acid etch solution, the step of conditioning the substrate with an aqueous alkaline conditioning solution having a pH of at least about 10, preferably a solution of at least one alkali metal hydroxide in which the alkali metal hydroxide concentration is from about 2 percent by weight to solution saturation, more preferably from about 10 to 50 percent by weight. The alkaline conditioning solution is maintained at a temperature from out 150° F. to the lesser of the boiling point of the solution and the softening point of the polyamide substrate. Contact is for a time sufficient to enable or enhance etching by an aqueous organic acid etch solution.

The presently preferred aqueous acid etch solutions are solutions which comprise from about 1 to about 10 percent by weight inorganic acid and at least one acetic acid compound of the formula:

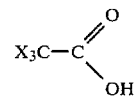

wherein each X is independently selected from the group consisiting of hydrogen, hydroxyl and halogen. Trichloroacetic acid is partially preferred.

Contact with the aqueous acid etch solution may be directly followed by seeding the surface with a metal electroless plating catalyst comprised of solutions of metal ions or suspensions of metal particles.

Following seeding and activation of the metal catalyst by conventional means, the surface can be uniformly plated with electroless copper or nickel.

Etching may be followed by rinsing debris from the surface of the substrate with an acid to alkaline rinse solution.

Alakline rinses are preferred, as even the use of the aqueous alkaline conditioning solution will not detract from the etch provided. More care must be taken in selection of the acid rinse. A strongly acid solution can degradably attack the polyamide and destroy the etch. In general, the acid should be less than about 4 N and preferably less than 3.5 N.

Contact time in the aqueous acid etch solution is normally from about 10 seconds to 15 minutes at room temperature, preferably from about 0.25 to about 3 minutes. When, as is presently preferred, a solution of an acetic acid compound is employed for etching the substrate, concentration is preferably from about 5 to about 60 percent by weight.

In conducting the process of the invention, the article may be treated by contacting the article in an aqueous solution of an organic solvent for the polyamide, prior to or following contact with the aqueous alkaline conditioning solution. Alternately, the organic solvent can be contained in the aqueous alkaline conditioning solution. The solvent in its solution is normally employed in a concentration up to about 5 percent by weight, preferably up to about 1 percent by weight. Ethylene glycol, phenolic compounds such as chlorophenol, cresols and salts thereof are presently preferred. As indicated, the solvent may be contained in its own bath or included in the alkaline conditioning solution so long as the organic solvent is not hydrolyzed or degraded. The solvent serves to soften plastic to aid etch by acid employed for etch, but does not serve an etch function.

As indicated, the substrate after etching may be further processed to remove the debris of etching by contact with acidic to basic wash.

DETAILED DESCRIPTION

According to the present invention, there is provided a process which enables uniform electroless deposition of metals onto polyamide substrates.

In particular, the processes of the present invention are directed to improvements in electroless plating of filled and unfilled polyamides such as Nylon 6 (caprolactam polymers) and Nylon 6,6.

The process of the instant invention includes, as a part thereof, contact of the polyamide substrate with an aqueous acid etch solution comprising at least one organic acid containing from 2 to 10 carbon atoms, preferably 2 to 4 carbon atoms, in the molecule contained in solution to a concentration of at least 3 percent by weight of solution in combination with from about 1 to about 10 percent by weight of solution, preferably from about 1 to about 5 percent by weight of solution of an inorganic acid. The inorganic acid may be an oxidizing or a reducing acid, but must be one which is substantially nondeleteriously reactive with the organic acid employed. A mixture of acids may be employed. The presently preferred acids are the mineral acids, sulfuric, nitric, hydrochloric and their mixtures. The presence of inorganic acid has been found to increase adhesion, all other factors being constant, enabling thereby adhesion to be improved with a lesser degree of softening of the surface of the polyamide substrate. This step alone will benefit the conditioning of caprolactam polymers (Nylon 6) for electroless plating and, when used in combination with treating the surface with an aqueous alkaline conditioning solution, is adaptive for treating of both Nylon 6 and Nylon 6,6. The amount of inorganic acid employed should be adequate to increase adhesion by at last about 0.5 lb./in. without degrading the surface or the organic acid.

In its preferred aspects, the invention includes, prior to contact with the aqueous acid etch solution, contacting the surface of a polyamide substrate with an aqueous alkaline conditioning solution having a pH of at least about 10 and maintained at a temperature of from about 150° F. to the lesser of the boiling point of the aqueous alkaline conditioning solution and the softening point of the polyamide.

Although solutions of alkali metal hydroxide are preferably employed as the aqueous alkaline conditioning solution, there may also be used alkaline compounds such as sodium metasilicate, trisodium phosphate, sodium carbonate and the like, used alone, in admixture and/or in combination with an alkali metal hydroxide.

When a conditioning solution of at least one alkali metal hydroxide is employed, the solution has an alkali metal hydroxide content of from about 2 percent by weight of solution to solution saturation, preferably about 10 to about 50 percent by weight.

The aqueous alkaline conditioning solutions are preferably employed at a temperature of from about 170° F. to about 200° F.

Contact is for a time sufficient to render the substrate receptive to attack by the acid etch; and after rinsing, is followed by contact of the polyamide substance with an aqueous acid etch solution. The preferred aqueous acid etch solutions are solutions comprising at least one inorganic acid and at least one soluble organic acid containing at least two carbon atoms, and contact is for a time sufficient to render the surface uniformly receptive to a metal catalyst, and as to at least filled polyamides, microporous. The metal catalyst may be in the form of a solution of functional metal ions or as a dispersion of metal particles. It is presently preferred that the organic acid be an acetic acid compound as defined below.

As part of the process measures, water rinsing with deionized water is performed for good housekeeping between each step. The substrate may also be treated with a dilute solution of solvent for the polyamide which serves to soften the surface of the polyamide to promote the etch, but without serving an etch function. Contact with the solvent may be prior to or after contact with the aqueous alkaline conditioning solution or contained in the aqueous alkaline conditioning solution. It is presently preferred to contact the substrate with the solvent following contact with the aqueous alkaline conditioning solution if an alkaline conditioning solution is employed.

The substrate may also be contacted with an acid to basic solution, subsequent to etch, to remove debris present on the surface of the substrate prior to surface activation with a catalyst. A base solution is preferred, as it does not degrade the surface of the polyamide. Acid solutions by contrast, and if too strong, will degrade the surface and remove the micropores provided by a functional aqueous acid etch solution. It has been observed that surface degradation of filled polyamides will occur for strong acids at concentrations of 4 N or more. Although dependent on the polyamide itself and strength of the acid, it is generally desirable to avoid the use of acids at a concentration above about 4 N. Preferably, acid concentration should be less than 3.5 N. This criterion may also be used in selecting acid concentration for the aqueous acid etch solution.

While reception of electroless plating onto the surface of any polyamide may be enhanced, the polyamides to be normally treated are filled polyamides as conventionally used in molding operations. Typical of such materials are filled Nylon 6, Nylon 6,6 and the like.

For universal application to polyamides, the first essential step of the process involves contacting the polyamide substrate with an aqueous alkaline conditioning solution. This step can be eliminated if the polyamide is a caprolactam. The presently preferred aqueous alkaline conditioning solutions are solutions of at least one alkali metal hydroxide, such as sodium and/or potassium hydroxide, present in a concentration from about 3 percent by weight of solution to solution saturation, preferably from about 10 to about 50 percent by weight.

Contact time may vary from about 0.5 to 20 minutes or more, depending upon temperature and the alkaline compound concentration, although it has been found that prolonged immersion will not damage the substrate. The object is to condition the surface of the substrate to make it receptive to attack by the aqueous acid etch solution.

Following water rinsing to remove the alkaline conditioning solution, the article is passed to an aqueous acid etch solution capable of rendering the conditioned surface directly receptive to an electroless plating catalyst and, if a filled nylon, microporous to provide anchor sites for the deposited plate. The aqueous acid etch solution is one based on organic acids containing from 2 to about 10 carbon atoms and having a water solubility of at least about 3 percent by weight of solution. The presently preferred etch is one comprising from about 5 percent by weight to about 60 percent by weight of solution and more preferably, from about 10 to about 25 percent by weight of solution of at least one acetic compound of the formula:

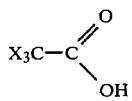

wherein each X is independently hydroxyl, hydrogen or halogen, with halogen preferred. Included in the etch is an inorganic acid.

Contact is normally at ambient or room temperature, although elevated temperatures may be employed. Contact times range from about 10 seconds to 15 minutes or more and are for a time sufficient to etch the surface of the polyamide to a degree that it becomes uniformly receptive to seeding by a metal catalyst. Filled nylons are rendered microporous. The micropores act as anchor sites for the electroless deposited metal, either copper or nickel, which serves as a buss for application of an electrolytic plate. A preferred contact time is from about 0.25 to about 3 minutes.

Among the acetic acid compounds which may be used in the etch there may be mentioned trichloroacetic acid, acetic acid, hydroxyacetic acid, dichloroacetic acid, chloroacetic acid, fluoroacetic acid, difluoroacetic acid, trifluoroacetic acid, bromacetic acid, dibromacetic acid and the like. Trichloroacetic acid is presently preferred.

Although several of the above acids are solvents for polyamides, they do not play a solvent function in the process. Rather, their prime role is to create, especially for filled polyamides, surface micropores which serve as anchor sites for the deposited plate. To this end, exposure time to the acid can be minimized to retard solvent action by the use of the inorganic acid, thereby eliminating or reducing long-term surface softening. At the same time, bond strength can be materially improved.

In sum, the use of an inorganic acid in combination with an organic acid in achieving a desired bond strength level can reduce contact time or concentration of the organic acid, and thereby eliminate or minimize softening.

There may be employed as part of the process contact with an organic solvent for the polyamide. If softening without etch is desired, the solvent may be in a separate bath used preceding and/or following the alkaline conditioning solution. It can be in the alkaline conditioning solution. The organic solvent softens the surface of the substrate to aid attack by the aqueous acid etch solution, but does not in itself serve an etch function. Typically, concentration of the solvent in its solution is up to about 5 percent by weight, preferably up to about 1 percent by weight. A wide variety of solvents for polyamides may be used. The presently preferred solvents are ethylene glycol, chlorophenol, cresols and salts thereof. If employed in the alkaline conditioner as its solution, the solvent should not be hydrolyzed or degraded by the aqueous alkaline solution.

In addition, subsequent to contact with the acid etch, the substrate may be brought into contact with an acid to alkaline solution of either an organic or inorganic acid or base to cleanse the surface of debris, i.e., filler and/or degraded resin. Such solutions are normally maintained at room temperature, although elevated temperatures may be employed. Although solutions used as the conditioner may be employed, solutions having an acidic or alkaline compound in concentration in the range of up to about 20 percent by weight, preferably up to about 10 percent by weight, may also be employed. Functional acids include hydrochloric acid, sulfuric acid, phosphoric acid, nitric acid, formic acid, acetic acid and the like. As indicated, to prevent surface degradation, acid concentration must be less than about 4 N(normal), preferably less than about 3.5 N. There may be used as a convenience to minimize the number of baths involved, the alkaline conditioning solution used for conditioning the substrate, as it has been found that the alkaline conditioning solution will not degrade the polyamide. Alternative solutions included such as solutions of borax, ammonium bifluoride and the like. As with the acid, the concentration is that which will enhance surface finish without detracting from the ability of the etched surface to accept a metal catalyst.

Whether or not the cleansing treatment is employed, the article is rinsed in water, usually deionized water, and seeded with a metal electroless plating catalyst.

The electroless plating catalysts employed may be noble metal- or non-noble metal-based. Non-noble metal catalysts are described in U.S. Pat. No. 3,958,048 to the same assignee as this application and incorporated herein by reference.

A noble metal catalyst in an aqueous medium is presently preferred. By a "noble metal catalyst contained in an aqueous medium" there is meant an ionic solution or colloidal suspension of the free metals. Colloidal suspensions are preferred. The noble metals include gold, platinum and palladium, with palladium preferred.

A suitable ionic bath is one containing palladium chloride in a concentration of about 0.2 grams per liter of solution and 3 ml of concentrated hydrochloric acid per liter of solution. Following seeding, the palladium can be reduced to the free metal state by immersion in a bath of a reducing agent such as dimethyl amine borane.

Colloidal suspensions of noble metals are described in U.S. Pat. No. 3,011,920 to C. R. Shipley, Jr., incorporated herein by reference. Such suspensions are colloidal in nature in which the noble metal colloid is maintained in suspension by a protective colloid, i.e., stannic acid colloids. Following seeding, the substrate is immersed in an accelerator to remove the protective colloid and expose the absorbed noble metal.

Although less preferred, there may also be employed a seeding method which involves contacting the etched article with a sensitizing solution containing stannous chloride followed by immersion in an activator solution, such as a palladium chloride solution, where the ionic palladium is reduced to the free metal on the surface of the substrate.

Suitably activated, the article may be electrolessly plated by conventional means. Electroless copper and nickel formulations, such as those described in U.S. Pat.

Nos. 3,011,920 and 3,874,072 incorporated herein by reference, may be employed. Electroless copper solutions are typically based on a soluble copper salt, such as copper sulfate, a complexing agent for the cupric ion such as Rochelle salt, an alkali hydroxide for adjustment of pH, a carbonate radical as a buffer, and a reducing agent for the cupric ion, such as formaldehyde.

Following electroless plating, the substrate may be electrolytically plated by conventional means, with nickel, gold, silver, chromium and the like to provide the desired finish on the article. It has been observed that adhesion will increase with age of the plate.

The following Examples and Controls show the effect of inorganic acid promotion of trichloroacetic acid (TCA) on bond strength of a deposited plate to Nylon 6 and Nylon 6,6. The article or substrate in each instance was first contacted with a 15-percent weight-to-volume aqueous solution of sodium hydroxide maintained at 200° F. (15% NaOH solution). After rinsing in deionized water, the substrate was etched in the solution defined below. Seeding of the etched substrate was with a proprietary colloidal tin-palladium catalyst as described in U.S. Pat. No. 3,011,920, at an acid molarity of about 1.7. An alkaline accelerator was used to expose the palladium metal. The catalyst was maintained at about 120° F. and the accelerator at about 105° F. The substrate was then electrolessly plated.

Following electroless plating, the substrate was rinsed in deionized water, soaked in an alkaline cleaner, then passed to a reverse current cleaner, an acid dip, bright acid copper and nickel electrolytic plating solutions and, finally, to a chromium plating solution.

EXAMPLES 1 TO 7 AND CONTROLS A TO G

Using a TCA solution containing 150 g/l TCA for the Controls, and a solution containing 150 g/l TCA and 50 cc/l HCl for the Examples, the average adhesion values were determined for the nylon substrates identified in Table I.

TABLE I

| Resin | Example | lb./in. | Control | Adhesion lb./in. | % Change |
|---|---|---|---|---|---|
| Firestone 540-001 Mineral-filled Nylon 6 | 1 | 6.5 | A | 5.0 | 30.0 |
| Wellman Mineral-filled Nylon 6 | | | | | |
| Virgin Feedstock | 2 | 4.1 | B | 2.5 | 64.0 |
| Regular Feedstock | 3 | 3.9 | C | 2.4 | 62.5 |
| Monsanto Mineral-filled Nylon 6,6 resins | | | | | |
| Resin A | 4 | 5.2 | D | 4.7 | 10.6 |
| Resin B | 5 | 5.1 | E | 4.0 | 27.5 |
| Resin C | 6 | 5.2 | F | 4.7 | 10.6 |
| Resin D | 7 | 7.1 | G | 5.7 | 24.5 |

EXAMPLES 8 TO 15 AND CONTROLS H TO M

Varying compositions were used to determine the effect on adhesion of the plate to Monsanto Resin D, a mineral-filled nylon 6,6. The results are tabulated in Table II.

TABLE II

| Etch Composition | | Total Acidity | Average Adhesion lb./in. |
|---|---|---|---|
| Example 8 | 150 g/l TCA + 10 cc/l HCl | 1.06 N | 6.15 |
| Example 9 | 150 g/l TCA + 20 cc/l HCl | 1.17 N | 6.70 |
| Example 10 | 150 g/l TCA + 30 cc/l HCl | 1.28 N | 6.05 |
| Example 11 | 150 g/l TCA + 40 cc/l HCl | 1.39 N | 6.70 |
| Example 12 | 150 g/l TCA + 50 cc/l HCl | 1.53 N | 7.05 |
| Example 13 | 150 g/l TCA + $H_2SO_4$ | 1.56 N | 7.05 |
| Example 14 | 150 g/l TCA + $HNO_3$ | 1.53 N | 6.60 |
| Example 15 | 150 g/l TCA + $H_3PO_4$ | 1.58 N | 5.60 |
| Control H | 150 g/l TCA | 0.954N | 5.65 |
| Control I | 251 g/l TCA | 1.54 N | 7.60 |
| Control J | 150 g/l TCA + Acetic acid | 1.50 N | 5.85 |
| Control K | 150 g/l TCA + Formic acid | 1.53 N | 6.05 |
| Control L | 150 g/l TCA + Citric acid | 1.48 N | 5.90 |
| Control M | 150 g/l TCA + Proprionic acid | 1.55 N | 5.30 |

What is claimed is:

1. In a process for preparing the surface of a polyamide substrate for electroless plating which includes the step of etching the polyamide substrate with an aqueous acid etch solution comprising at least one organic acid containing from 2 to about 10 carbon atoms in the molecule and present in the aqueous solution in a concentration of at least about 3 percent by weight of the solution and sufficient to render the polyamide substrate directly receptive to an electroless plating catalyst and depositing a metal electroless plating catalyst on the surface of the etched polyamide substrate, the improvement which comprises including in the aqueous acid etch solution from about 1 to about 10 percent by weight of solution of at least one inorganic acid which is nondeleteriously reactive with respect to said organic acid.

2. A process as claimed in claim 1 in which the inorganic acid is present in a concentration of from about 1 to about 5 percent by weight of the aqueous acid etch solution.

3. A process as claimed in claim 1 in which the inorganic acid is a mineral acid selected from the group consisting of sulfuric acid, nitric acid, hydrochloric acid and mixtures thereof.

4. A process as claimed in claim 1 in which the polyamide is a filled polyamide.

5. A process for preparing the surface of polyamide substrates for electroless plating which comprises:
(a) forming a conditioned polyamide substrate for etching by contacting the polyamide substrate with an aqueous alkaline conditioning solution having a pH of at least about 10 and maintained at a temperature of from about 150° F. to the lesser of the boiling point of the solution and the softening temperature of the polyamide substrate for a time sufficient to render the substrate receptive to etch by an organic acid; and
(b) etching the conditioned polyamide substrate by contacting the conditioned polyamide substrate with an aqueous acid etch solution comprising at least one water-soluble organic acid containing from 2 to about 10 carbon atoms in the molecule and present in the aqueous solution in a concentration of at least about 3 percent by weight of the solution and from about 1 to about 10 percent by weight of an acid which is at least one inorganic acid which is nondeleteriously reactive with said inorganic acid and in which the acid concentration is sufficient to render the conditioned polyamide substrate substantially uniformly and directly receptive to a metal electroless plating catalyst.

6. A process as claimed in claim 5 in which the concentration of the inorganic acid is from about 1 to about 5 percent by weight of solution.

7. A process as claimed in claim 5 in which the inorganic acid is a mineral acid selected from the group consisting of sulfuric acid, nitric acid, hydrochloric acid and mixtures thereof.

8. A process as claimed in claim 5 in which the polyamide is a filled polyamide.

9. A process for preparing the surface of polyamide substrates for electroless plating which comprises:
(a) forming a conditioned polyamide substrate for etching by contacting the polyamide substrate with an aqueous alkaline conditioning solution of at least one alkali metal hydroxide in which the alkali metal hydroxide concentration of the aqueous alkaline conditioning solution is from about 2 percent by weight of the solution to solution saturation and maintained at a temperature of from about 150° F. to the lesser of the boiling point of the solution and the softening temperature of the polyamide surface for a time sufficient to render the polyamide substrate receptive to etch by an acetic acid compound; and
(b) etching the conditioned polyamide substrate by contacting the conditioned polyamide substrate with an aqueous acid etch solution comprising at least one acetic acid compound having the formula:

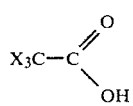

wherein each X is independently selected from the group consisting of hydrogen, hydroxyl and halogen and from about 1 to about 10 percent by weight of an acid which is at least one inorganic acid which is nondeleteriously reactive with said acetic acid compound and in which the acid concentration is sufficient to render the conditioned polyamide substrate substantially uniformly and directly receptive to a metal electroless plating catalyst.

10. A process as claimed in claim 9 in which the inorganic acid is present in a concentration of from about 1 to about 5 percent by weight of solution.

11. A process as claimed in claim 9 in which the inorganic acid is a mineral acid selected from the group consisting of sulfuric acid, nitric acid, hydrochloric acid and mixtures thereof.

12. A process as claimed in claim 9 in which the polyamide is a filled polyamide.

13. A process as claimed in claim 9 in which the acetic acid compound is trichloroacetic acid.

14. A process as claimed in claim 9 in which the acetic acid compound is dichloroacetic acid.

15. A process as claimed in claim 9 in which the acetic acid compound is acetic acid.

16. A process for preparing the surface of polyamide substrates for electroless plating which comprises:
(a) forming a conditioned polyamide substrate by contacting the polyamide substrate with an aqueous alkaline conditioning solution of at least one alkali metal hydroxide in which the total alkali metal hydroxide concentration is from about 10 percent by weight of the solution to solution saturation and maintained at a temperature of from about 150° F. to the lesser of the boiling point of the solution and the softening temperature of the polyamide surface for a period of time of from about 0.5 to about 20 minutes; and
(b) forming an etched polyamide substrate by contacting the conditioned polyamide substrate with an aqeuous acid etch solution comprising from 1 to about 10 percent by weight of a mineral acid selected from the group consisting of hydrochloric acid, sulfuric acid, nitric acid and mixtures thereof, and at least one acetic acid compound selected from the group consisting of trichloroacetic acid, dichloroacetic acid and acetic acid in which the acid concentration is sufficient to render the conditioned polyamide substrate substantially uniformly and directly receptive to a metal electroless plating catalyst.

17. A process as claimed in claim 16 in which the mineral acid concentration is from about 1 to about 5 percent by weight of solution.

18. A process as claimed in claim 16 in which the polyamide substrate is formed of a filled polyamide.

19. A process as claimed in claim 16 in which the total alkali metal hydroxide content of the aqueous alkaline conditioning solution is from 10 to about 50 percent by weight of the solution.

20. A process as claimed in claim 16 in which the aqueous alkaline conditioning solution is maintained at a temperature of from about 170° F. to about 200° F.

21. A process as claimed in claim 16 in which the total acetic acid compound concentration of the aqueous acid etch solution is from about 5 percent by weight of solution to solution saturation.

22. A process as claimed in claim 16 in which the total acetic acid compound concentration of the aqueous acid etch solution is from about 5 to about 60 percent by weight of the solution.

23. A process as claimed in claim 16 in which the polyamide substrate is contacted with the aqueous acid etch solution for a period of time of from about 10 seconds to about 15 minutes.

24. A process for preparing the surface of filled polyamide substrates for electroless plating which comprises:
(a) forming a conditioned polyamide substrate by contacting the filled polyamide substrate with an aqueous alkaline conditioning solution of at least one alkali metal hydroxide in which the total alkali metal hydroxide concentration is from about 10 percent by weight of the solution to solution saturation and maintained at a temperature of from about 150° F. to the lesser of the boiling point of the solution and the softening temperature of the polyamide surface for a period of time of from about 10 seconds to about 20 minutes; and
(b) forming an etched polyamide substrate by contacting the conditioned polyamide substrate with an aqueous etch solution comprising from about 1 to about 10 percent by weight of mineral acid selected from the group consisting of hydrochloric acid, sulfuric acid, nitric acid and mixtures thereof, and trichloroacetic acid present in concentration from about 5 percent by weight of solution to solution saturation, the total acid concentration being sufficient to render the conditioned filled polyamide substrate uniformly and directly receptive to a metal electroless plating catalyst.

25. A process as claimed in claim 24 in which the mineral acid concentration is from about 1 to about 5 percent by weight of solution.

26. A process for preparing the surface of a caprolactam polymer substrate for electroless plating which comprises etching the caprolactam substrate with an aqueous organic acid etch solution comprising at least one organic acid compound containing 2 to 4 carbon atoms in the molecule and soluble in a concentration of at least about 3 percent by weight of solution in combination with from about 1 to about 10 percent by weight of solution of an inorganic acid, said acids present in a concentration sufficient to render the caprolactam substrate uniformly and directly receptive to a metal electroless plating catalyst and depositing a metal electroless plating catalyst on the surface of th etched caprolactam surface.

27. A process as claimed in claim 26 in which the inorganic acid concentration is from about 1 to about 5 percent by weight of solution and in which the organic acid compound concentration is from about 5 to about 60 percent by weight of solution.

28. A process as claimed in claim 26 in which the organic acid compound is at least one acetic acid compound having the formula:

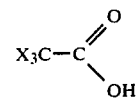

wherein each X is independently selected from the group consisting of hydrogen, hydroxyl and halogen.

29. A process as claimed in claim 26 in which the organic acid compound is trichloroacetic acid.

30. A process as claimed in claim 26 in which the inorganic acid is a mineral acid selected from the group consisting of hydrochloric acid, sulfuric acid, nitric acid and mixtures thereof.

31. A process as claimed in claim 27 in which the inorganic acid is a mineral acid selected from the group consisting of hydrochloric acid, sulfuric acid, nitric acid and mixtures thereof.

32. A process as claimed in claim 28 in which the inorganic acid is a mineral acid selected from the group consisting of hydrochloric acid, sulfuric acid, nitric acid and mixtures thereof.

* * * * *